United States Patent
Aoyama (10) Patent No.: US 8,435,872 B2
(45) Date of Patent: May 7, 2013

(54) METHOD AND APPARATUS FOR MANUFACTURING SEMICONDUCTOR DEVICE

(75) Inventor: Tomonori Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 12/831,604

(22) Filed: Jul. 7, 2010

(65) Prior Publication Data

US 2011/0008952 A1  Jan. 13, 2011

(30) Foreign Application Priority Data

Jul. 7, 2009  (JP) ................ P2009-161229

(51) Int. Cl.
*H01L 21/26* (2006.01)

(52) U.S. Cl.
USPC .............. 438/535; 438/566; 257/E21.349

(58) Field of Classification Search .......... 438/535, 438/565, 566; 257/E21.349
See application file for complete search history.

(56) References Cited

U.S. PATENT DOCUMENTS

| 7,135,423 B2* | 11/2006 | Downey ......... 438/795 |
| 7,169,657 B2* | 1/2007 | Zhang et al. ...... 438/166 |
| 2008/0111185 A1* | 5/2008 | Cheng .......... 257/347 |
| 2008/0166824 A1* | 7/2008 | Suzuki .......... 438/17 |

FOREIGN PATENT DOCUMENTS

JP  10-189473  7/1998

OTHER PUBLICATIONS

Fukano, et al., "Microwave Annealing for Low Temperature VLSI Processing", IEDM 85, International Electron Devices Meeting, Tech. Digest, pp. 224-227, (Dec. 1985).

* cited by examiner

*Primary Examiner* — Chandra Chaudhari
(74) *Attorney, Agent, or Firm* — Finnegan, Henderson, Farabow, Garrett & Dunner, L.L.P.

(57) ABSTRACT

According to one embodiment, in a method for manufacturing a semiconductor device, a surface region of a semiconductor substrate is modified into an amorphous layer. A microwave is irradiated to the semiconductor substrate in which the amorphous layer is formed in a dopant-containing gas atmosphere so as to form a diffusion layer in the semiconductor substrate. The dopant is diffused into the amorphous layer and is activated.

14 Claims, 8 Drawing Sheets

NMOS REGION    PMOS REGION

FIG. 7

NMOS REGION    PMOS REGION

METHOD AND APPARATUS FOR MANUFACTURING SEMICONDUCTOR DEVICE

CROSS REFERENCE TO RELATED APPLICATION

This application is based upon and claims the benefit of priority from the prior Japanese Patent Application No. 2009-161229, filed on Jul. 7, 2009, the entire contents of which are incorporated herein by reference.

FIELD

Embodiments described herein relate generally to a method and an apparatus for manufacturing a semiconductor device.

BACKGROUND

In an LSI (Large Scale Integration) of a next generation or later, an extension diffusion layer with a depth shallower than 10 nm is required, and a new impurity doping technology and an ultra short time anneal technology are being developed at present so as to form such an extremely shallow diffusion layer.

Usually, in order to form a diffusion layer, after an impurity is doped in a semiconductor substrate, the semiconductor substrate is annealed. So as to form an extremely shallow diffusion layer using such a method, with respect to a doping technology a plasma doping and so on are noticed considering a three dimensional structure, and with respect to an anneal technology an ultra short time anneal such as a laser anneal, a flashlight anneal and so on are noticed.

But in such technologies, a process to dope an impurity and a process to anneal are performed by separate apparatuses for manufacturing a semiconductor device, which invites an increase in equipment investment cost. In addition, in the laser anneal and the flashlight anneal, as a surface of a semiconductor substrate is heated to a high temperature, a temperature difference is generated between the front surface and a rear surface of the semiconductor substrate, and the semiconductor substrate curves by heat stress, so that there is a possibility to generate a problem and so on that crystal defects such as crystal dislocation and so on generates in the semiconductor substrate.

In addition, with respect to another method to form a diffusion layer, there is a method where after an impurity layer is formed in a semiconductor substrate by an ion implantation and so on, a microwave is irradiated to the semiconductor substrate to anneal whole the semiconductor substrate. Such a method for manufacturing a semiconductor device is disclosed in Japanese Patent Application Publication No. 10-189473.

But in such a method for manufacturing a semiconductor device, in case that an extremely shallow diffusion layer with a depth of not more than 10 nm is formed, it is necessary to decrease sufficiently an acceleration voltage in ion implantation. When the acceleration voltage is low, a variation is generated in the distribution of the impurity in a depth direction, so that there is a possibility that the desired extremely shallow diffusion layer can not be formed. In addition, in the same manner as in the above-described laser anneal and so on, an apparatus for manufacturing a semiconductor device so as to dope an impurity and an apparatus for manufacturing a semiconductor device so as to anneal a semiconductor substrate are required separately, which invites an increase in equipment investment cost.

DETAILED DESCRIPTION

According to one embodiment, in a method for manufacturing a semiconductor device, a surface region of a semiconductor substrate is modified into an amorphous layer. A microwave is irradiated to the semiconductor substrate in which the amorphous layer is formed in a dopant-containing gas atmosphere so as to form a diffusion layer in the semiconductor substrate. The dopant is diffused into the amorphous layer and is activated.

According to another embodiment, in a method for manufacturing a semiconductor device, a surface region of a side wall of a semiconductor layer is modified into an amorphous layer. The semiconductor layer is formed on a semiconductor substrate. A microwave is irradiated to the semiconductor layer of which the amorphous layer is formed in the side wall in a dopant-containing gas atmosphere so as to form a diffusion layer in the side wall of the semiconductor layer. The dopant is diffused into the amorphous layer and is activated.

According to further another embodiment, an apparatus for manufacturing a semiconductor device includes a chamber to load a semiconductor substrate inside, at least one microwave waveguide connected to the chamber so as to introduce the microwave into the chamber and an impurity gas introducing piping connected to the chamber so as to introduce the impurity gas into the chamber.

Hereinafter, further embodiments will be described with reference to the drawings. In the drawings, same reference characters denote the same or similar portions.

[First Embodiment]

A first embodiment will be described with reference to FIGS. 1 to 9. FIGS. 1 to 9 are the cross-sectional views each schematically showing a main portion in the order of manufacturing steps of the semiconductor device according to the first embodiment.

The embodiment is an example of manufacturing a semiconductor device which includes CMOS (Complementary Metal Oxide Semiconductor) transistors with an extension structure.

Figure 1:
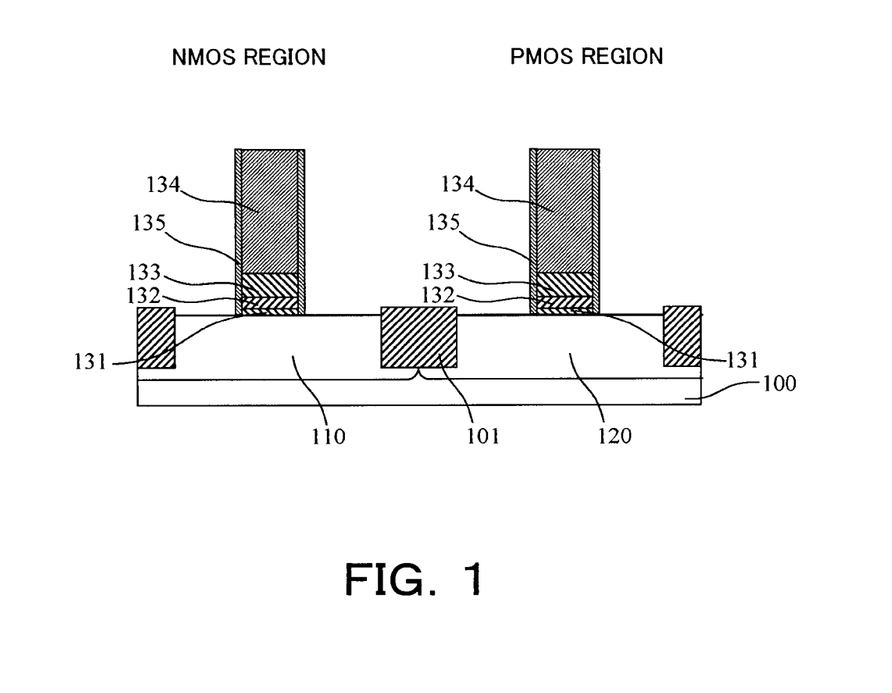
FIG. 1 is a cross-sectional view schematically showing a main portion in the order of manufacturing steps of the semiconductor device according to a first embodiment.

To begin with, as shown in FIG. 1, an element isolation region 101 with an STI (Shallow Trench Isolation) structure is formed using a known method on a main surface of a silicon substrate (semiconductor substrate) 100 so as to zone a region to form a PMOSFET (hereinafter, referred to simply as "PMOS region") and a region to form a NMOSFET (hereinafter, referred to simply as "NMOS region"). Next, an N well diffusion layer 120 is formed in the PMOS region and a P well diffusion layer 110 is formed in the NMOS region using a well know method. Next, using a known method, in each of the PMOS region and the NMOS region, an interface layer 131 composed of SiON, a high dielectric constant gate insulating film 132 composed of HfSiON, a TiN film 133, a gate electrode 134 composed of a polycrystalline silicon film doped with impurity, and an offset spacer 135 are formed.

Figure 2:
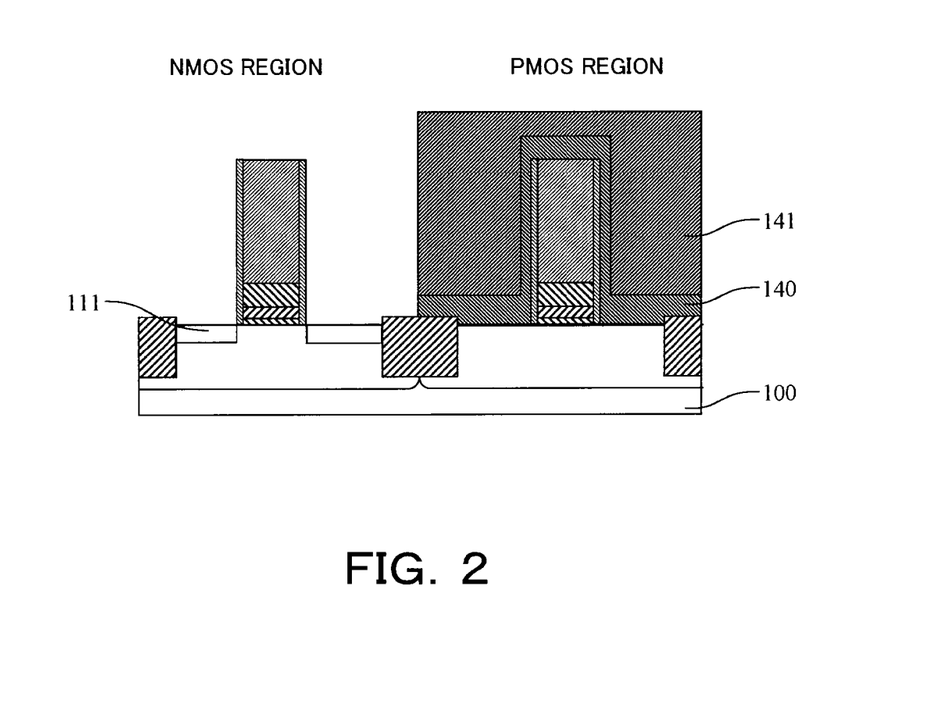
FIG. 2 is a cross-sectional view schematically showing the main portion in the order of manufacturing steps of the semiconductor device according to the first embodiment.

Next, as shown in FIG. 2, an $SiO_2$ film 140 is deposited on each of the NMOS region and the PMOS region of the silicon substrate 100, and then the $SiO_2$ film 140 of the NMOS region is removed by etching using a resist 141 with an opening portion at the NMOS region formed by a known method as a mask. After that, an upper portion of the silicon substrate 100 of the NMOS region is modified into an amorphous portion by implanting germanium (Ge) ions into the silicon substrate 100 of the NMOS region which is exposed from the $SiO_2$ film 140. By this, a layer 111 which is made amorphous (hereinafter referred to as simply "amorphous layer") is formed at the upper portion of the silicon substrate 100 of the NMOS region. With respect to a method to form the amorphous layer 111, ions of other elements such as argon (Ar), krypton (Kr) and so on may be implanted other than the above-described ion implantation method by Ge.

By making the upper portion of the silicon substrate 100 amorphous, silicon atoms in the amorphous layer 111 become easy to move. By this, in a process to form an extension diffusion layer described below, it becomes possible to diffuse and activate dopant effectively in the amorphous layer 111.

In addition, it is preferable that a depth of the amorphous layer 111 is formed deeper than a desired depth of the extension diffusion layer described below. That is, in case that the desired depth of the extension diffusion layer is 10 nm, for example, it is preferable that the depth of the amorphous layer 111 is formed deeper than 10 nm. If a depth of the amorphous layer 111 is formed shallower than a depth of the extension diffusion layer, the dopant becomes difficult to be activated at a region of the extension diffusion layer deeper than the amorphous layer 111. But, by forming the amorphous layer 111 deeper than the desired depth of the extension diffusion layer, the dopant is activated to a depth of the desired depth of the extension diffusion layer, so that the extension diffusion layer can be effectively formed to the desired depth. In addition, the term "depth" means a distance from the surface of the silicon substrate 100 in the direction vertical to the surface of the silicon substrate 100.

Figure 3:
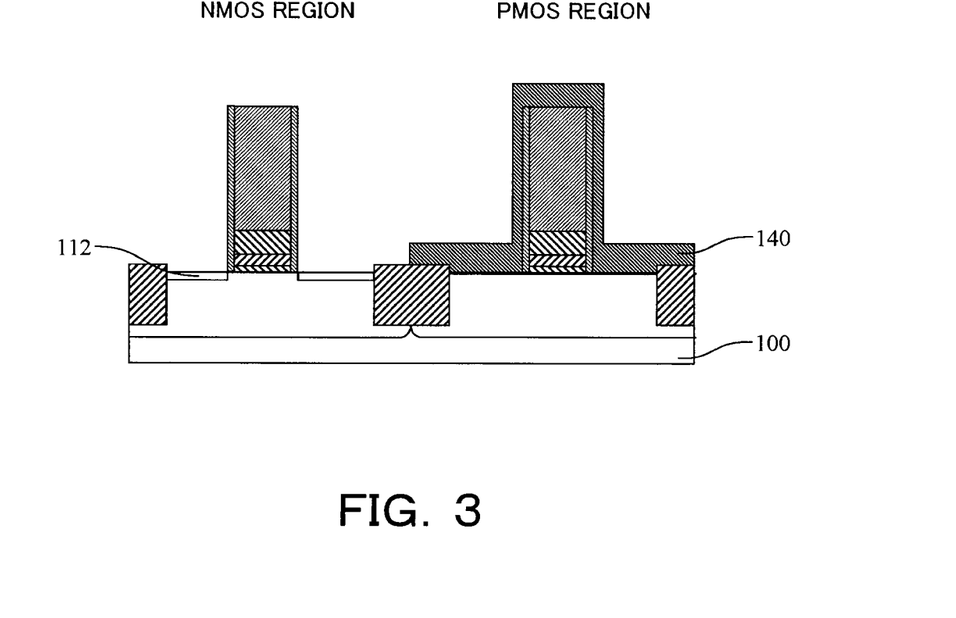
FIG. 3 is a cross-sectional view schematically showing the main portion in the order of manufacturing steps of the semiconductor device according to the first embodiment.

Next, as shown in FIG. 3, after the resist 141 is removed, a microwave is irradiated to the silicon substrate 100 in the atmosphere of an impurity gas (arsine ($AsH_3$), or phosphine ($PH_3$) and so on, for example). By this, the dopant included in the impurity gas diffuses and is activated in the surface of the silicon substrate 100 of the NMOS region, so that a diffusion layer (an extension diffusion layer) 112 is formed. A process to form the diffusion layer 112 is performed by introducing the impurity gas into a chamber (not shown) in which the silicon substrate 100 is loaded, and in addition introducing a microwave into the chamber. In the above-described method to form the diffusion layer using the microwave, the impurity gas including dopant comes in contact with the silicon substrate 100 in which silicon atoms vibrate or rotate by the irradiation of the microwave, and the dopant diffuses into the amorphous layer 111 formed in the silicon substrate 100 and in addition the dopant is activated.

In the vibration or the rotation of the silicon atoms induced in the silicon substrate by the microwave irradiation, it is possible to keep the surface temperature of the silicon substrate at a low temperature of 200° C. to 600° C. For the reason, while suppressing a rapid diffusion of the impurity due to temperature gradient, a modest diffusion of the impurity due to Brownian movement takes place, and as the impurity is activated by the vibration or the rotation of the silicon atoms, an extremely shallow diffusion layer can be formed. In addition, the term "impurity gas" in the embodiment means a gas including dopant to be introduced into the diffusion layer.

In addition, it is preferable that a frequency of the microwave which is irradiated to the silicon substrate is 2.45 GHz, 5.80 GHz or 24.125 GHz which is designated as ISM (Industrial, Scientific and Medical Use) band. That is because a magnetron and so on to generate the microwave can be obtained at a low price. In addition, the microwave usually used has a definite frequency band, and the above-described 2.45 GHz, 5.80 GHz or 24.125 GHz is a frequency included in the frequency band of the microwave to be used.

Figure 10:
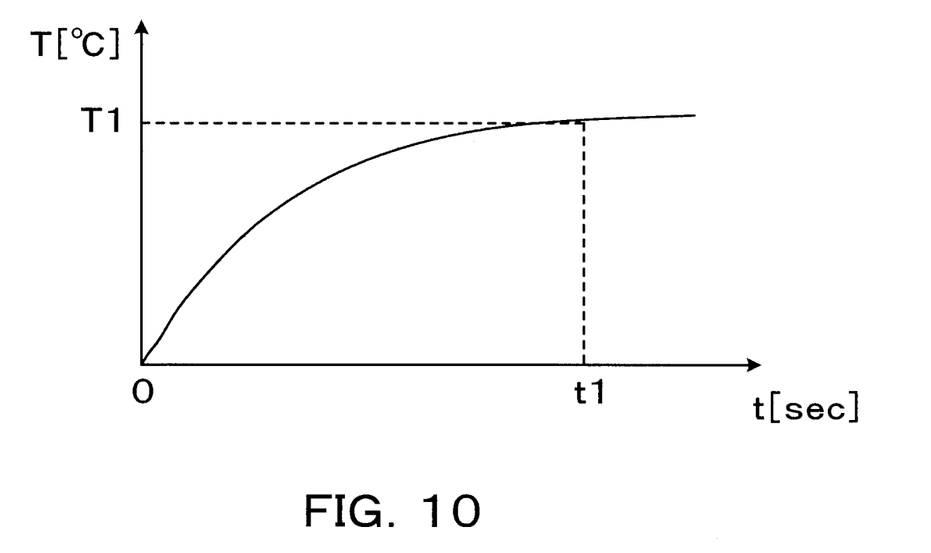
FIG. 10 is a graph schematically showing a change in a temperature of a semiconductor substrate in the main portion of the manufacturing step of the semiconductor device according to the first embodiment.

In addition, a timing to introduce a microwave and an impurity gas into a chamber will be described with reference to FIG. 10. FIG. 10 is a diagram schematically showing a change in a temperature of a silicon substrate caused by irradiating the microwave. As shown in FIG. 10, when it is started to introduce the microwave in the chamber at t=0 [sec], the temperature reaches a temperature T=T1 [° C.] where the amorphous layer 111 of the silicon substrate 100 begins to crystallize at t=t1 [sec]. When the amorphous layer 111 crystallizes silicon atoms become difficult to move, and in the process to form the diffusion layer the amount of the dopant diffusing into the amorphous layer 111 decreases so that the diffusion layer can not formed effectively. For the reason, it is preferable to start to introduce the impurity gas into the chamber before the temperature reaches the temperature (in FIG. 10, T=T1 [° C.]) where the amorphous layer 111 begins to crystallize.

In addition, it is preferable that the microwave is introduced into the chamber under the condition that the impurity gas in the chamber is not ionized to plasma by the microwave. This is because of preventing that unnecessary contamination material generates from the wall of the chamber or a jig.

Figure 4:
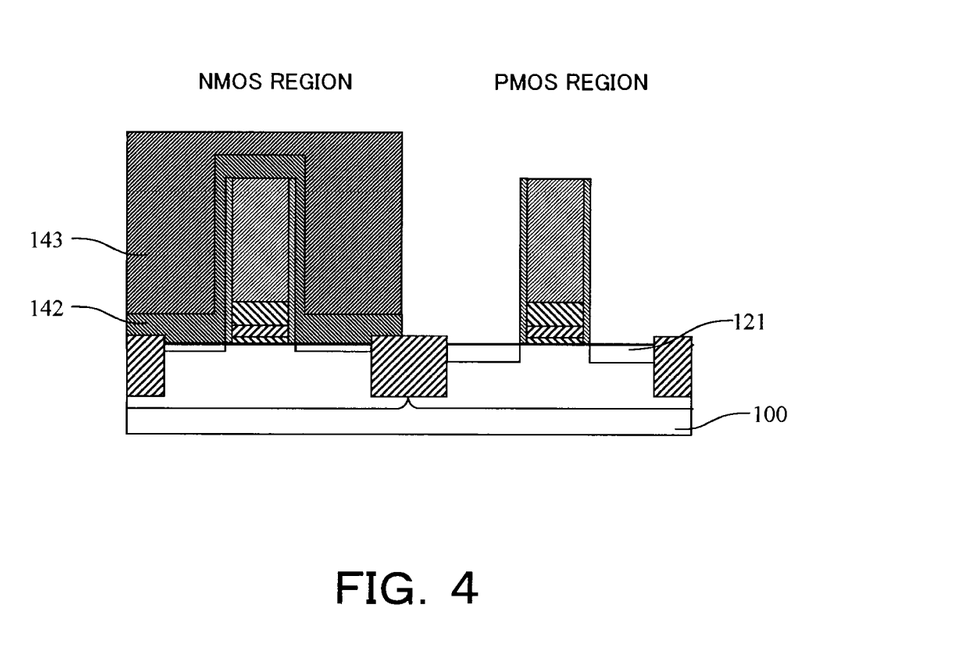
FIG. 4 is a cross-sectional view schematically showing the main portion in the order of manufacturing steps of the semiconductor device according to the first embodiment.

Next, as shown in FIG. 4, the $SiO_2$ film 140 is removed by etching, and after an $SiO_2$ film 142 is deposited on each of the NMOS region and the PMOS region the $SiO_2$ film 142 of the PMOS region is removed by etching using a resist 143 with an opening portion at the PMOS region formed by a known method as a mask. After that, an upper portion of the silicon substrate 100 at the PMOS region is modified into an amorphous portion by implanting germanium (Ge) ions into the silicon substrate 100 of the PMOS region which is exposed from the $SiO_2$ film 142. By this, a layer 121 which is made amorphous (hereinafter referred to as simply "amorphous layer") is formed at the upper portion of the silicon substrate 100 of the PMOS region. With respect to a method and condition to make amorphous is the same as in the case to form the amorphous layer 111 at the NMOS region as described above, and the descriptions thereof are omitted. Then the resist 143 is removed by etching.

Figure 5:
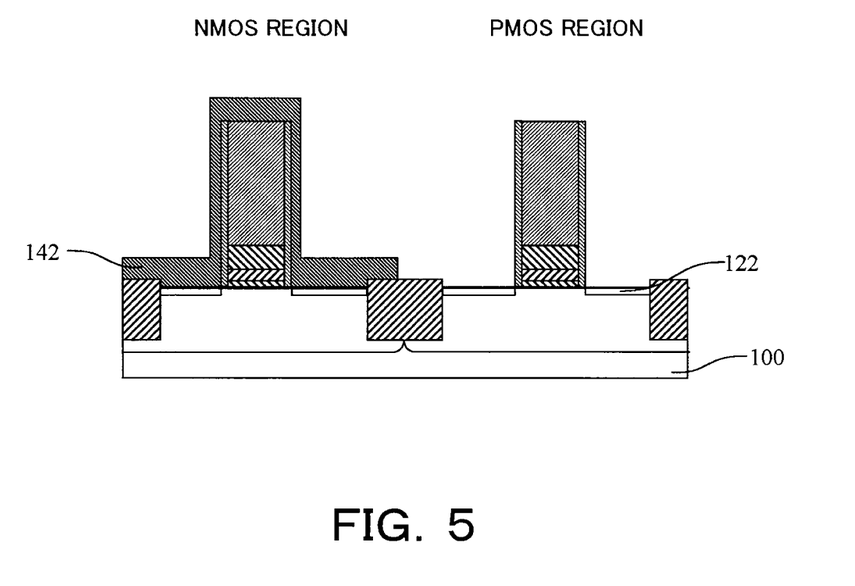
FIG. 5 is a cross-sectional view schematically showing the main portion in the order of manufacturing steps of the semiconductor device according to the first embodiment.

Next, as shown in FIG. 5, after the resist 143 is removed, a microwave is irradiated to the silicon substrate 100 in the atmosphere of an impurity gas (boron trifluoride ($BF_3$), or diborane ($B_2H_6$) and so on, for example). By this, the dopant included in the impurity gas diffuses in the surface of the silicon substrate 100 at the PMOS region, so that a diffusion layer (an extension diffusion layer) 122 is formed. A process to form the diffusion layer 122 is performed by introducing the impurity gas into a chamber (not shown) in which the silicon substrate 100 is loaded, and in addition introducing a microwave in the chamber. With respect to a condition to irradiate the microwave and an effect caused by using the microwave and so on are the same as in the case to form the amorphous layer 112 as described above, and the descriptions thereof are omitted.

Figure 6:
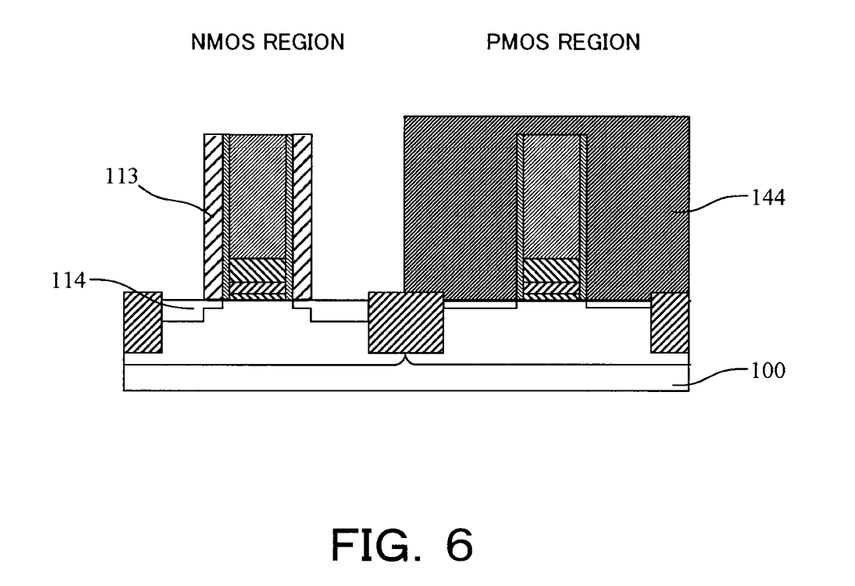
FIG. 6 is a cross-sectional view schematically showing the main portion in the order of manufacturing steps of the semiconductor device according to the first embodiment.

Next, as shown in FIG. 6, after the $SiO_2$ film 142 is removed by etching a side wall 113 is formed at the NMOS region by a known method. Then, an N-type source/drain diffusion layer 114 is formed using a resist 144 with an opening portion at the NMOS region as a mask. Then, the resist 144 is removed by etching.

Figure 7:
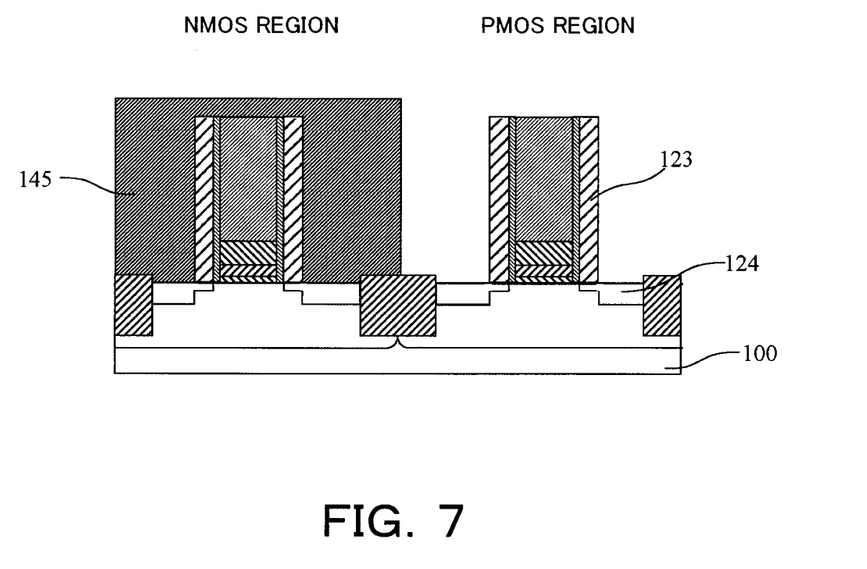
FIG. 7 is a cross-sectional view schematically showing the main portion in the order of manufacturing steps of the semiconductor device according to the first embodiment.

Next, as shown in FIG. 7, after a side wall 123 is formed at the PMOS region by a known method, a P-type source/drain diffusion layer 124 is formed using a resist 145 with an opening portion at the PMOS region as a mask. Then, the resist 145 is removed by etching.

Figure 8:
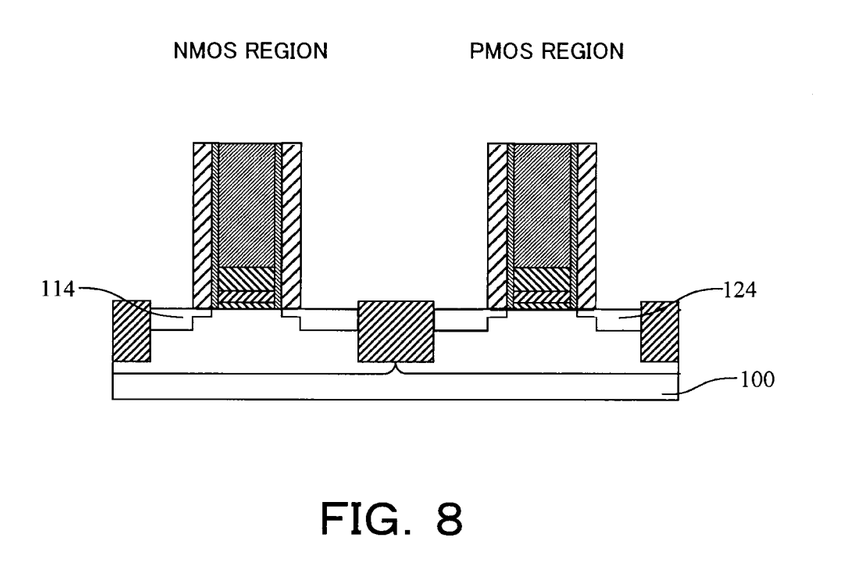
FIG. 8 is a cross-sectional view schematically showing the main portion in the order of manufacturing steps of the semiconductor device according to the first embodiment.

Next, as shown in FIG. 8, after an inert gas is introduced into the chamber in which the silicon substrate 100 is loaded, a microwave is introduced into the chamber. By this, the silicon substrate 100 is annealed in the atmosphere of the inert gas at a temperature of 200° C. to 600° C. by the microwave, and the N-type source/drain diffusion layer 114 and the P-type source/drain diffusion layer 124 are activated. In addition, as the microwave penetrates through the silicon substrate 100, the microwave can also be used to activate a deep diffusion layer such as the N-type source/drain diffusion layer 114 and the P-type source/drain diffusion layer 124.

Figure 9:
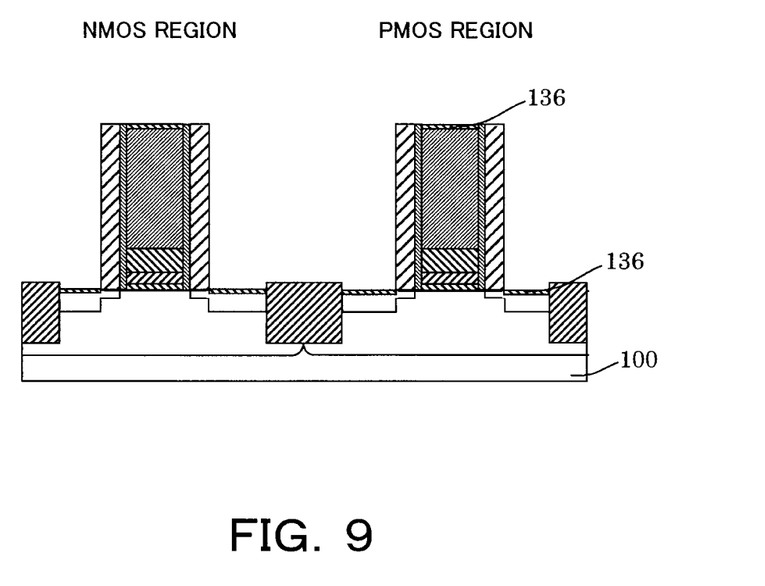
FIG. 9 is a cross-sectional view schematically showing the main portion in the order of manufacturing steps of the semiconductor device according to a first embodiment.

Next, as shown in FIG. 9, nickel silicide 136 is formed on each of the surface of the N-type source/drain diffusion layer 114, the surface of the P-type source/drain diffusion layer 124, and the upper surfaces of the gate electrodes 134, respectively.

As described above, in the embodiment, in case of forming the extension diffusion layers (the diffusion layers 112, 122) of the CMOS transistor, a microwave is irradiated to the silicon substrate 100 in the impurity gas atmosphere. By this, it can be made possible to diffuse and activate the dopant in a low temperature, so that the extremely shallow diffusion layers can be formed.

In addition, the description was made with respect to the case of forming the extension diffusion layers of the CMOS transistor in the embodiment. But a method for manufacturing a semiconductor device according to the embodiment is not limited to the case, but can be applied to cases for forming various extremely shallow diffusion layers.

In addition, the silicon substrate was used as the semiconductor substrate in which the diffusion layer is formed in the embodiment. But a semiconductor substrate in which an extremely shallow diffusion layer is formed is not limited to a silicon substrate, but various semiconductor substrates can be used.

[Second Embodiment]

Figure 11:
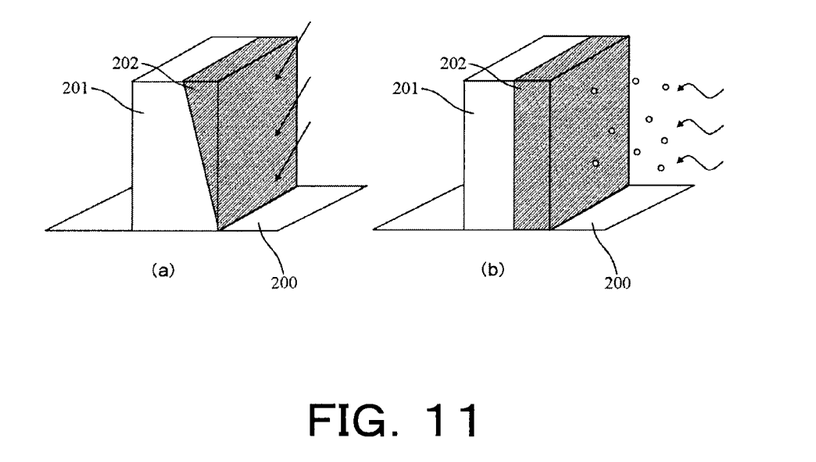
FIG. 11 is a perspective view schematically showing an impurity doping into a side wall of a three dimensional structure in the main portion of manufacturing step of a semiconductor device according to a second embodiment.

A method for manufacturing a semiconductor device according a second embodiment will be described with reference to FIG. 11. FIG. 11 is a diagram showing a main portion of a method for manufacturing a semiconductor device according to a second embodiment, and a schematic diagram to explain a case that a diffusion layer is formed in a side wall of a three dimensional structure.

FIG. 11(a) shows typically a case that a diffusion layer is formed in a side wall of a three dimensional structure by a conventional method. Here, a conventional method indicates a method to form a diffusion layer in a semiconductor substrate by an ion implantation and then to activate the diffusion layer by annealing the semiconductor substrate. FIG. 11(b) shows typically a case that a diffusion layer is formed in a side wall of a three dimensional structure by a method according to the embodiment. In addition, in the following description with respect to the embodiment, a direction in parallel with a surface of a semiconductor substrate 200 is referred to as "a horizontal direction", and a direction perpendicular to the surface of the semiconductor substrate 200 is referred to as "a vertical direction".

As shown in FIG. 11(a), in case that a diffusion layer 202 is formed in a side wall of a semiconductor layer 201 of a three dimensional structure by a conventional method, after ions are implanted in the side wall from an approximately vertical direction (a direction in approximately parallel with the side wall of the semiconductor layer 201), the semiconductor layer 201 is annealed. With respect to an ion implantation method, there is an oblique ion implantation method, but it is difficult to perform ion implantation in the surface of the side wall of the semiconductor layer 201 from the vertical direction. For the reason, as shown in FIG. 11(a), there is a possibility that the diffusion layer formed by the oblique ion implantation method and so on is not uniform for a depth direction (horizontal direction) of the diffusion layer.

On the other hand, as shown in FIG. 11(b), in case that the diffusion layer 202 is formed in a side wall of the semiconductor layer 201 of a three dimensional structure by a method according to the embodiment, after an amorphous layer is formed by an ion implantation and so on into the semiconductor layer 201, a microwave is irradiated to the semiconductor layer 201 in an impurity gas atmosphere. In the method, it is possible to irradiate the microwave to the surface of the side wall of the semiconductor layer 201 from the approximately vertical direction. For the reason, as shown in FIG. 11(b), the impurity gas comes in contact with the silicon substrate in which silicon atoms vibrate approximately uniformly by the microwave, and the dopant diffuses into the amorphous layer formed in the semiconductor layer 201 and the dopant is activated, so that an approximately uniform diffusion layer can be formed. In addition, according to the method, even if the amorphous layer is not formed approximately uniform in the side wall of the semiconductor layer 201 for a depth direction, the diffusion layer 202 with an approximately uniform depth can be formed by forming the amorphous layer substantially deeper than the depth of the diffusion layer 202.

Next, with reference to FIG. 12, a case of forming a source/drain diffusion layer of a FinFET will be described to which a method for manufacturing a semiconductor device according to the second embodiment is applied. Processes except a process to form the source/drain diffusion layer of the FinFET are the same as in an existing method, so that the description is omitted. In addition, the construction of each portion of the FinFET is the same as an existing construction, so that the description is omitted.

Figure 12:
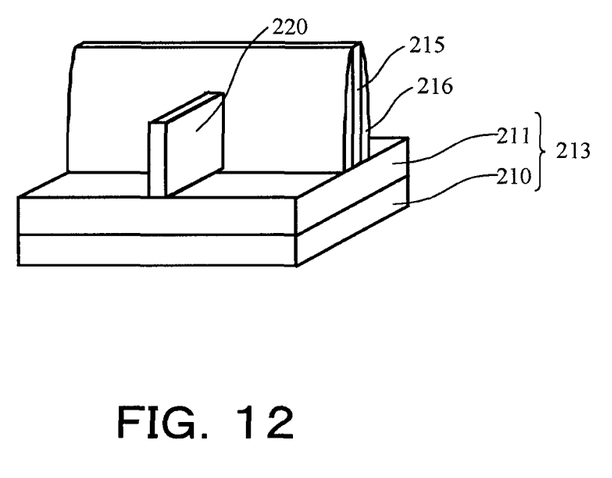
FIG. 12 is a perspective view schematically showing the structure of the semiconductor device according to the second embodiment.

FIG. 12 is a perspective view showing the construction of a FinFET. As shown in FIG. 12, a FinFET includes a gate electrode 215, a gate electrode side wall 216 and a source/drain region 220 on a semiconductor substrate 213 composed of a silicon substrate 210 with a buried oxide film 211 formed on the silicon substrate 210.

As shown in FIG. 12, in the construction of the FinFET, the source/drain region 220 has a three dimensional structure. For the reason, in case that an impurity diffusion layer is formed in the source/drain region 220 of the FinFET, after an amorphous layer is formed in the source/drain region 220 by an ion implantation and so on, a microwave is irradiated to the source/drain region 220 in an impurity gas atmosphere. By this, the dopant which is included in the impurity gas diffuses in the surface of the source/drain region 220 and a uniform diffusion layer (the source/drain region 220) can be formed.

As described above, in the embodiment, in case that the diffusion layer is formed in the semiconductor layer of the three dimensional structure, the microwave is irradiated to the semiconductor layer in the impurity gas atmosphere. By this, a diffusion layer which is uniform in the direction vertical to the surface of the side wall can be formed in the side wall of the semiconductor layer of the three dimensional structure.

[Third Embodiment]

Figure 13:
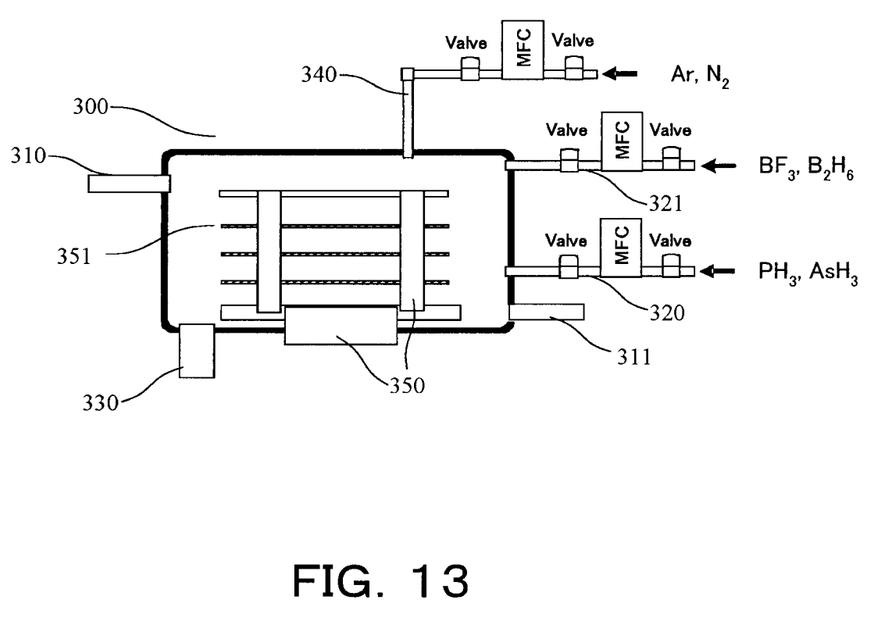
FIG. 13 is a view schematically showing an apparatus for manufacturing the semiconductor device according to a third embodiment.

An apparatus for manufacturing a semiconductor device according to a third embodiment will be described with reference to FIG. 13. FIG. 13 is a pattern diagram showing an apparatus for manufacturing a semiconductor device which is used for a method for manufacturing a semiconductor device according to the first embodiment or the second embodiment.

The apparatus for manufacturing a semiconductor device is provided with a chamber 300 to load a silicon substrate inside, microwave waveguides 310, 311 each of which is connected to the chamber 300 so as to introduce a microwave into the chamber 300, and impurity gas introducing pipings 320, 321 each of which is connected to the chamber 300 so as to introduce an impurity gas into the chamber 300. With respect to the microwave waveguides 310, 311, without limited to a case that the two are provided, it may be enough that one or more microwave waveguides are provided.

A boat 350 is provided in the chamber 300. A silicon substrate 351 is loaded on the boat 350.

Each of the microwave waveguides 310, 311 is connected to a microwave output source such as a magnetron oscillator (not shown) and so on, and introduces a microwave from the microwave output source into the chamber 300. With respect to the microwave output source, a traveling wave tube oscillator and a klystron oscillator and so on can be supposed except the magnetron oscillator.

Each of the impurity gas introducing pipings 320, 321 introduces an impurity gas into the chamber 300 so as to form a diffusion layer in the silicon substrate 351 loaded in the chamber 300. The impurity gas introducing piping 320 is used so as to introduce a gas such as $AsH_3$, $PH_3$ and so on into the chamber 300. The impurity gas introducing piping 321 is used so as to introduce a gas such as $BF_3$, $B_2H_6$ and so on into the chamber 300.

In addition, an exhaust piping 330 so as to exhaust the gas in the chamber 300 and an inert gas introducing piping 340 so as to introduce an inert gas in the chamber 300 are provided to the chamber 300.

In this way, in the apparatus for manufacturing a semiconductor device according to the embodiment, by providing the microwave wave guides 310, 311 and the impurity gas introducing pipings 320, 321, the impurity gas can be introduced in the chamber 300 and in addition the microwave can be introduced in the chamber 300. By this, it can be made possible to form a desired diffusion layer in the semiconductor substrate loaded in the chamber 300, as shown in the first embodiment and the second embodiment.

While certain embodiments have been described, these embodiments have been presented by way of example only, and are not intended to limit the scope of the inventions. Indeed, the novel methods and apparatus described herein may be embodied in a variety of other forms; furthermore, various omissions, substitutions and changes in the form of the methods and apparatus described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   modifying a surface region of a semiconductor substrate into an amorphous layer by implanting impurity ions into the semiconductor substrate; and
   irradiating a microwave to the semiconductor substrate in which the amorphous layer is formed in a dopant-containing gas atmosphere so as to form a diffusion layer in the semiconductor substrate, the dopant being diffused into the amorphous layer from the dopant-containing gas atmosphere and being activated.

2. The method for manufacturing the semiconductor device according to claim 1, wherein the amorphous layer is formed more deeply than the diffusion layer.

3. The method for manufacturing the semiconductor device according to claim 1, wherein the impurity is germanium, argon or krypton.

4. The method for manufacturing the semiconductor device according to claim 1, wherein
   the semiconductor substrate in which the amorphous layer is formed is loaded in a chamber, the microwave is introduced into the chamber so as to heat the semiconductor substrate and the dopant-containing gas is introduced into the chamber before a surface temperature of the semiconductor substrate reaches a temperature where the amorphous layer begins to crystallize.

5. The method for manufacturing the semiconductor device according to claim 4, wherein the surface temperature of the semiconductor substrate is from 200° C. to 600° C.

6. The method for manufacturing the semiconductor device according to claim 4, wherein the dopant-containing gas comes in contact with the amorphous layer where the constituent atoms of the amorphous layer are vibrating or rotating by the microwave irradiation so that the dopant is diffused into the amorphous layer and is activated.

7. The method for manufacturing the semiconductor device according to claim 1, wherein the microwave is irradiated under the condition that the dopant-containing gas is not ionized to plasma.

8. The method for manufacturing the semiconductor device according to claim 1, wherein the dopant-containing gas is either a p-type dopant-containing gas or an n-type dopant-containing gas.

9. The method for manufacturing the semiconductor device according to claim 8, wherein the p-type dopant-containing gas is boron trifluoride or diborane.

10. The method for manufacturing the semiconductor device according to claim 8, wherein the n-type dopant-containing gas is arsine or phosphine.

11. A method for manufacturing a semiconductor device, comprising:

modifying a surface region of a side wall of a semiconductor layer into an amorphous layer by implanting impurity ions into the semiconductor layer, the semiconductor layer being formed on a semiconductor substrate; and irradiating a microwave to the semiconductor layer of which the amorphous layer is formed in the side wall in a dopant-containing gas atmosphere so as to form a diffusion layer in the side wall of the semiconductor layer, the dopant being diffused into the amorphous layer from the dopant-containing gas atmosphere and being activated.

12. The method for manufacturing the semiconductor device according to claim 11, wherein the amorphous layer is formed more deeply than the diffusion layer.

13. The method for manufacturing the semiconductor device according to claim 12, wherein the amorphous layer with non-uniform depth is formed in the side wall of the semiconductor layer, the diffusion layer with approximately uniform depth is formed in the side wall of the semiconductor layer.

14. The method for manufacturing the semiconductor device according to claim 11, wherein the microwave is irradiated to the semiconductor layer from a direction approximately vertical to the surface of the sidewall of the semiconductor layer.

\* \* \* \* \*